United States Patent
Li et al.

(10) Patent No.: US 11,239,366 B2
(45) Date of Patent: Feb. 1, 2022

(54) TRANSISTORS WITH AN ASYMMETRICAL SOURCE AND DRAIN

(71) Applicant: GLOBALFOUNDRIES U.S. Inc., Santa Clara, CA (US)

(72) Inventors: Wenjun Li, Saratoga Springs, NY (US); Man Gu, Malta, NY (US); Baofu Zhu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/776,938

(22) Filed: Jan. 30, 2020

(65) Prior Publication Data

US 2021/0242339 A1 Aug. 5, 2021

(51) Int. Cl.
*H01L 21/336* (2006.01)
*H01L 29/78* (2006.01)
*H01L 21/8238* (2006.01)
*H01L 29/08* (2006.01)

(52) U.S. Cl.
CPC .... *H01L 29/785* (2013.01); *H01L 21/823864* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 6,794,256 B1 | 9/2004 | Fuselier et al. | |
| 7,354,839 B2 | 4/2008 | Wei et al. | |
| 7,465,976 B2 * | 12/2008 | Kavalieros | H01L 29/7391 257/196 |
| 7,989,297 B2 | 8/2011 | Yin et al. | |
| 8,633,082 B2 | 1/2014 | Lasserre et al. | |
| 9,991,165 B1 | 6/2018 | Huang | |
| 2009/0090980 A1 | 4/2009 | King et al. | |
| 2011/0049582 A1 | 3/2011 | Johnson et al. | |
| 2011/0108918 A1 | 5/2011 | Yin et al. | |
| 2013/0214357 A1 | 8/2013 | Chang et al. | |
| 2014/0252477 A1 * | 9/2014 | Tseng | H01L 29/785 257/347 |

(Continued)

OTHER PUBLICATIONS

Jiehui Shu et al., "Transistors With Separately-Formed Source and Drain", filed Aug. 15, 2019 as U.S. Appl. No. 16/541,600.

(Continued)

*Primary Examiner* — Ali Naraghi
(74) *Attorney, Agent, or Firm* — Thompson Hine LLP; Francois Pagette (57) ABSTRACT

Structures for a field-effect transistor and methods of forming a structure for a field-effect transistor. A gate structure extends over a semiconductor body, a first source/drain region includes an epitaxial semiconductor layer on a first portion of the semiconductor body, and a second source/drain region is positioned in a second portion of the semiconductor body. The gate structure includes a first sidewall and a second sidewall opposite the first sidewall, the first source/drain region is positioned adjacent to the first sidewall of the gate structure, and the second source/drain region is positioned adjacent to the second sidewall of the gate structure. The first source/drain region has a first width, and the second source/drain region has a second width that is greater than the first width.

17 Claims, 8 Drawing Sheets

(56) References Cited

U.S. PATENT DOCUMENTS

2018/0269303 A1\* 9/2018 Zhang .................. H01L 29/167
2018/0277662 A1\* 9/2018 Liang .................. H01L 29/7848
2019/0096883 A1 3/2019 Chen et al.

OTHER PUBLICATIONS

Taiwan Intellectual Property Office, Examination Report received Sep. 1, 2021 in Taiwanese Patent Application No. 109146897.
Taiwan Intellectual Property Office, Notice of Allowance dated Nov. 29, 2021 in Taiwanese Patent Application No. 109146897.

\* cited by examiner

TRANSISTORS WITH AN ASYMMETRICAL SOURCE AND DRAIN

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a semiconductor body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current. Fin-type field-effect transistors are formed using a semiconductor fin as the semiconductor body and may include multiple gates that overlap with multiple channel regions in the semiconductor fin.

The source and drain of a field-effect transistor are simultaneously formed. One approach is to implant ions containing a p-type dopant or an n-type dopant into regions of the semiconductor body to provide the source and drain. Another approach is to epitaxially grow sections of a semiconductor material from the semiconductor body to form the source and drain. The epitaxially-grown semiconductor material is in situ doped during growth with either a p-type dopant or an n-type dopant.

The operating characteristics of a field-effect transistor depend, among other factors, on the manner in which the source and drain are formed. Because of their simultaneous formation by either ion implantation or epitaxial growth, the properties of the source and drain cannot be individually engineered to optimize the operating characteristics of the field-effect transistor for certain design applications.

A problem associated with wide gate pitches in a multi-gate field-effect transistor is that the epitaxially-grown semiconductor material forming the source and drain may be underfilled. The underfilling may degrade device performance, such as degradation of radiofrequency performance metrics such as the value for the maximum stable gain. The underfilling may also degrade other performance metrics, such as reducing the drain current when the transistor is biased in the saturation region (Idsat) and increasing the contact resistance.

Improved structures for a field-effect transistor and methods of forming a structure for a field-effect transistor are needed.

SUMMARY

In an embodiment of the invention, a structure for a field-effect transistor is provided. The structure includes a semiconductor body, a gate structure that extends over the semiconductor body, a first source/drain region including an epitaxial semiconductor layer on a first portion of the semiconductor body, and a second source/drain region in a second portion of the semiconductor body. The gate structure includes a first sidewall and a second sidewall opposite the first sidewall, the first source/drain region is positioned adjacent to the first sidewall of the gate structure, and the second source/drain region is positioned adjacent to the second sidewall of the gate structure. The first source/drain region has a first width, and the second source/drain region has a second width that is greater than the first width.

In an embodiment of the invention, a method of forming a structure for a field-effect transistor is provided. The method includes forming a gate structure that extends over a semiconductor body, forming an epitaxial semiconductor layer of a first source/drain region on a first portion of the semiconductor body, and forming a second source/drain region in a second portion of the semiconductor body. The gate structure includes a first sidewall and a second sidewall opposite the first sidewall, the first source/drain region is positioned adjacent to the first sidewall of the gate structure, and the second source/drain region positioned adjacent to the second sidewall of the gate structure. The first source/drain region has a first width, and the second source/drain region has a second width that is greater than the first width.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
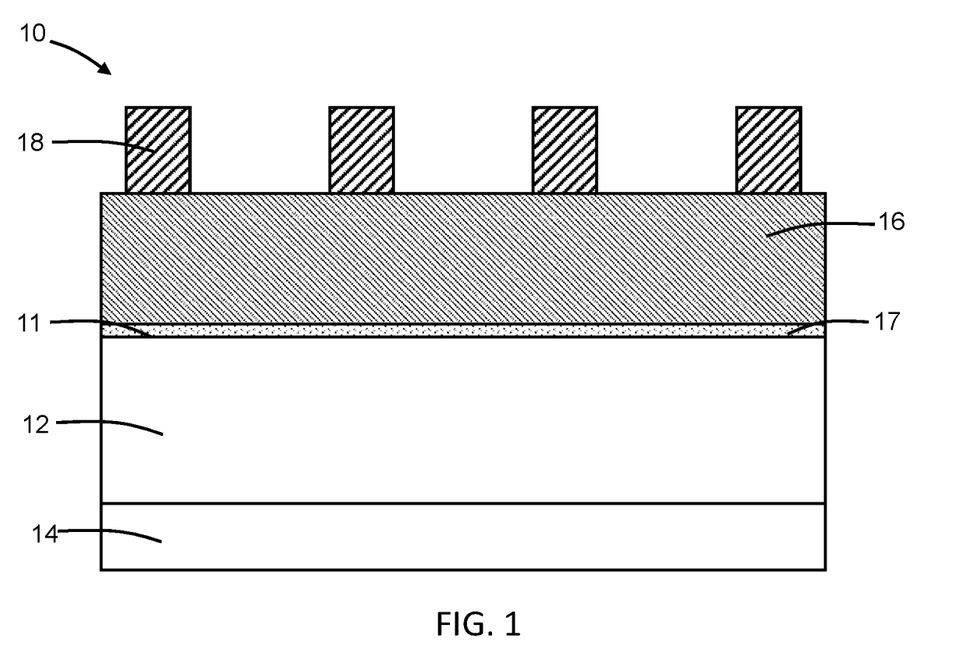
FIGS. 1-8 are cross-sectional views of a structure for a fin-type field-effect transistor at successive fabrication stages of a processing method in accordance with embodiments of the invention.

With reference to FIG. 1 and in accordance with embodiments of the invention, a structure 10 for a field-effect transistor includes a fin 12 that is arranged over, and projects upwardly away from, a substrate 14. The fin 12 and the substrate 14 may be composed of a single-crystal semiconductor material, such as single-crystal silicon. The fin 12 may be formed by patterning the substrate 14 with lithography and etching processes or by a self-aligned multi-patterning process. Shallow trench isolation (not shown) may surround a lower section of the fin 12.

A layer 16 of a material, such as polycrystalline silicon (i.e., polysilicon), and a layer 17 of a dielectric material, such as silicon dioxide, are formed over the fin 12 and shallow trench isolation. The layer 17 is arranged between the layer 16 and the fin 12. Hardmask sections 18 are formed that are arranged over a top surface 11 of the fin 12 and that may extend across the shallow trench isolation. The hardmask sections 18 may be formed by patterning a layer of a dielectric material, such as silicon nitride, with lithography and etching processes. The hardmask sections 18 may be strips that have a parallel arrangement and a given uniform pitch.

Figure 2:
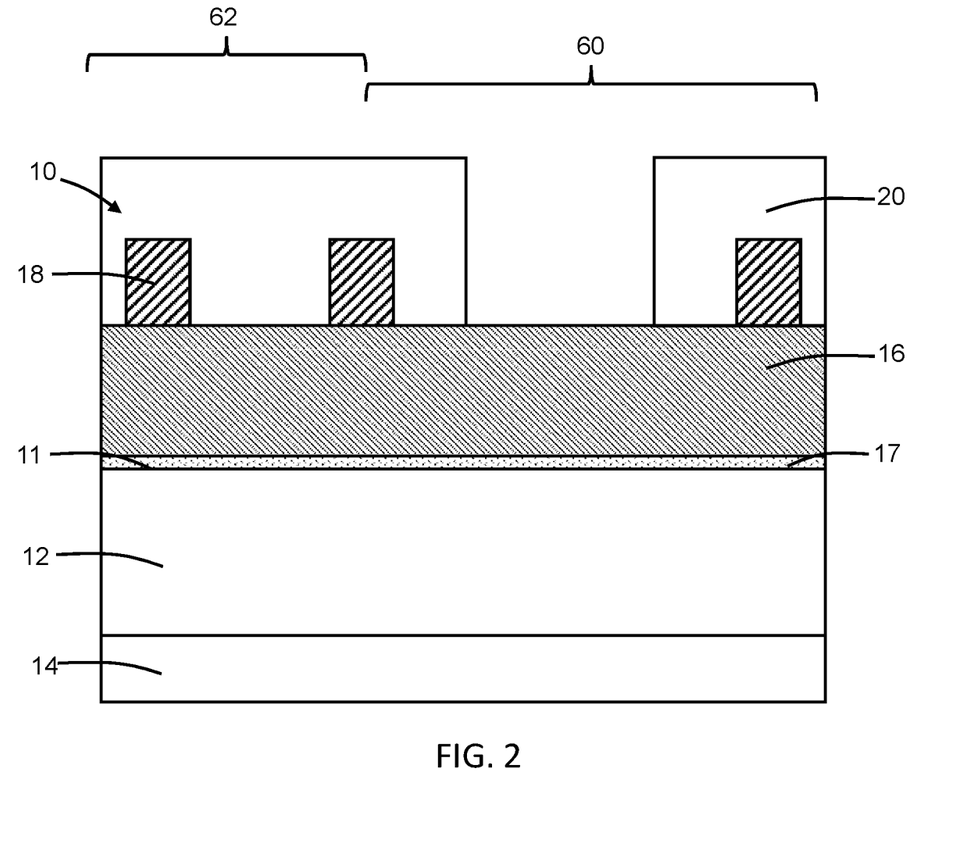

With reference to FIG. 2 in which like reference numerals refer to like features in FIG. 1 and at a subsequent fabrication stage, one of the hardmask sections 18 is removed by lithography and etching processes. An etch mask 20 may be formed by the lithography process that masks the hardmask sections 18 that are retained and exposes the hardmask section 18 to be removed by etching. The etch mask 20 may include a layer of a light-sensitive material, such as a photoresist, applied by a spin-coating process, pre-baked, exposed to light projected through a photomask, baked after exposure, and developed with a chemical developer. The etching process may be a reactive ion etching process. The etch mask 20 is stripped following patterning.

The removal of the hardmask section 18 locally increases the pitch of the hardmask sections 18 in a region 60. The original pitch is retained in the adjacent region 62. In particular, the pitch is locally doubled by the removal of the hardmask section 18. In alternative embodiments, multiple adjacent hardmask sections 18 may be removed to provide an additional increase in the local pitch. For example, a pair of adjacent hardmask section 18 may be removed to locally triple the pitch of the hardmask sections 18 in region 60.

Figure 3:
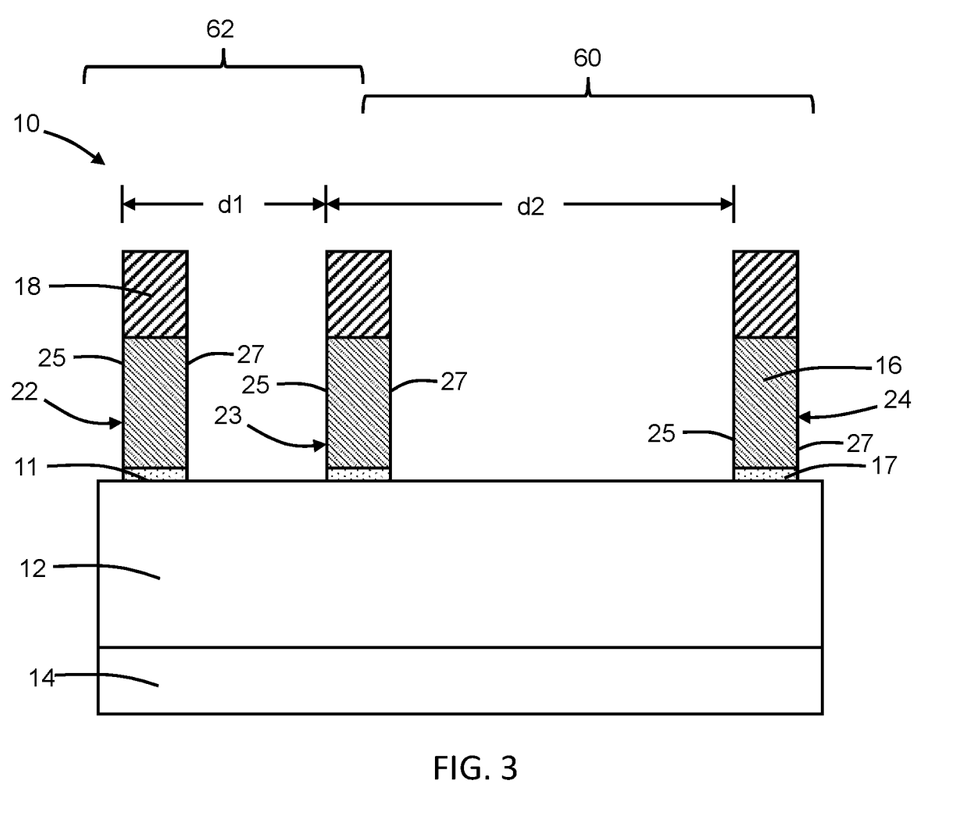

With reference to FIG. 3 in which like reference numerals refer to like features in FIG. 2 and at a subsequent fabrication stage, the layer 16 is patterned to define gate structures 22, 23, 24 that extend laterally along respective longitudinal axes over and across the fin 12 and across the trench isolation. Each of the gate structures 22, 23, 24 is aligned transverse to the fin 12 and overlaps with, and wraps about, the fin 12. Each of the gate structures 22, 23, 24 may include a dummy gate composed of the material of layer 16 and a dielectric layer composed of the material of layer 17. The hardmask sections 18 are arranged as gate caps over the gate structures 22, 23, 24, and each of the gate structures 22, 23, 24 includes opposite sidewalls 25, 27.

The gate structures 22, 23, 24, which are dummy elements, adopt the pattern, including the multiple pitches, of the hardmask sections 18. The result is that the sidewall 25 of the gate structure 22 and the sidewall 25 of the gate structure 23 are separated by a distance, d1, and the sidewall 25 of the gate structure 23 and the sidewall 25 of the gate structure 24 are separated by a distance, d2, that is greater than the distance, d1. In an embodiment, the distance, d2, may be equal or approximately equal to twice the distance, d1. In this embodiment, the gate structures 22, 23 may have a 1CPP (contacted (poly) pitch) gate pitch and the gate structures 23, 24 may have a 2CPP gate pitch. In other embodiments, the distance, d2, may be equal or approximately equal to an integer multiple of the distance, d1, contingent upon the number of adjacent hardmask sections 18 that are removed. In an embodiment in which the integer is three (3) and the gate structure 24 is removed, the gate structures 22, 23 may have a 1CPP (contacted (poly) pitch) gate pitch, and the gate structure 23 and the gate structure (not shown) adjacent to the removed gate structure 24 may have a 3CPP gate pitch.

Figure 4:
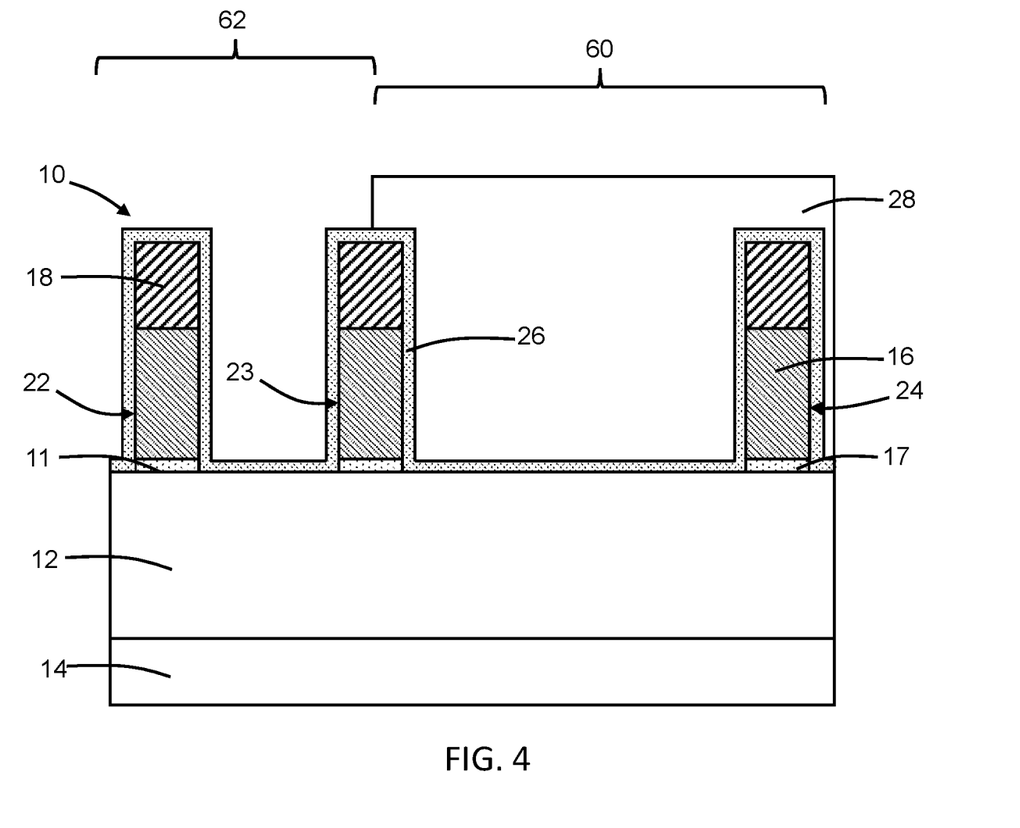

With reference to FIG. 4 in which like reference numerals refer to like features in FIG. 3 and at a subsequent fabrication stage, a conformal layer 26 composed of, for example, a low-k dielectric material is deposited as a liner over the gate structures 22, 23, 24 and fin 12 by, for example, atomic layer deposition. The conformal layer 26 may have a uniform thickness that is independent of position. A block mask 28 is formed that covers the conformal layer 26 over the portion of the fin 12 between the gate structure 23 and the gate structure 24. The block mask 28 may be a spin-on hardmask composed of an organic material that is patterned with lithography and etching processes.

Figure 5:
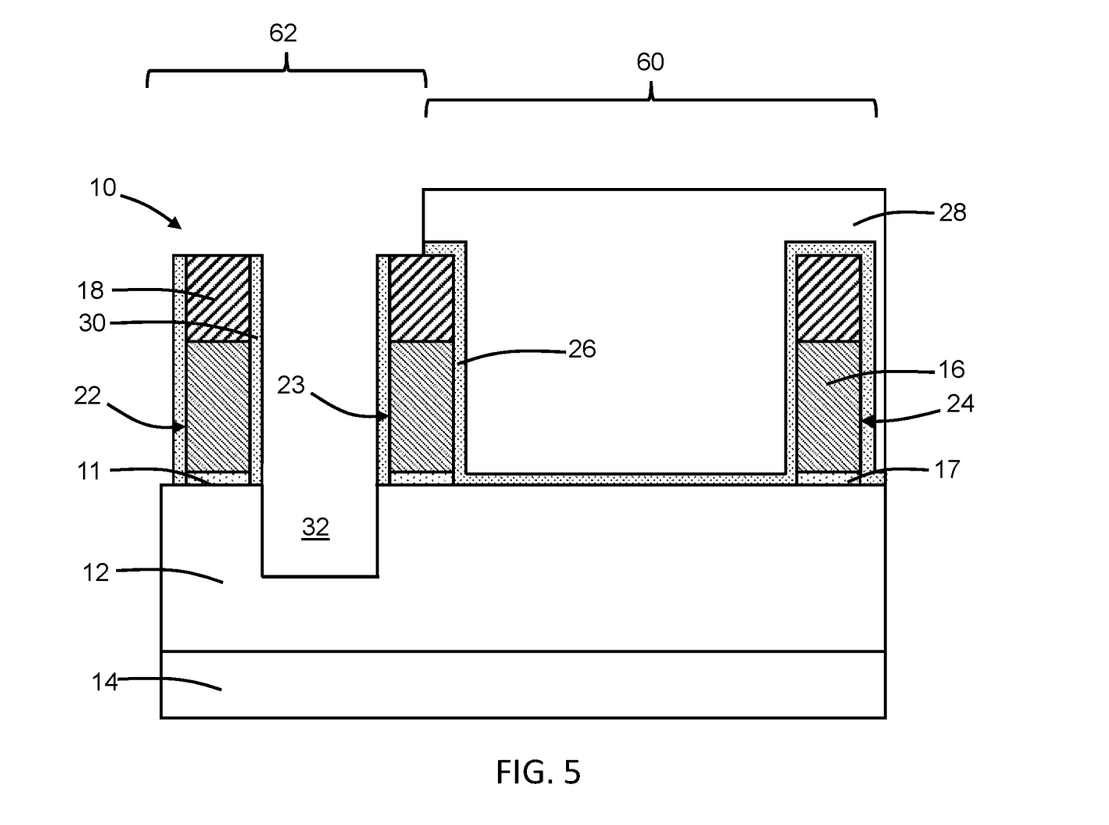

With reference to FIG. 5 in which like reference numerals refer to like features in FIG. 4 and at a subsequent fabrication stage, sidewall spacers 30 are formed by etching the conformal layer 26 with an anisotropic etching process, such as reactive ion etching. The sidewall spacers 30 are arranged between the gate structure 22 and the gate structure 23. The conformal layer 26 is masked by the block mask 28 during the etching process.

A cavity 32 is formed in the fin 12 by an etching process, such as an anisotropic etching process (e.g., reactive ion etching). The cavity 32 is positioned in a portion of the fin 12 laterally between the gate structure 22 and the gate structure 23. The block mask 28 operates as an etch mask to protect the conformal layer 26 and underlying portion of the fin 12 between the gate structures 23, 24 during the etching process forming the cavity 32. The block mask 28 may be stripped by, for example, an ashing process after the cavity 32 is formed.

Figure 6:
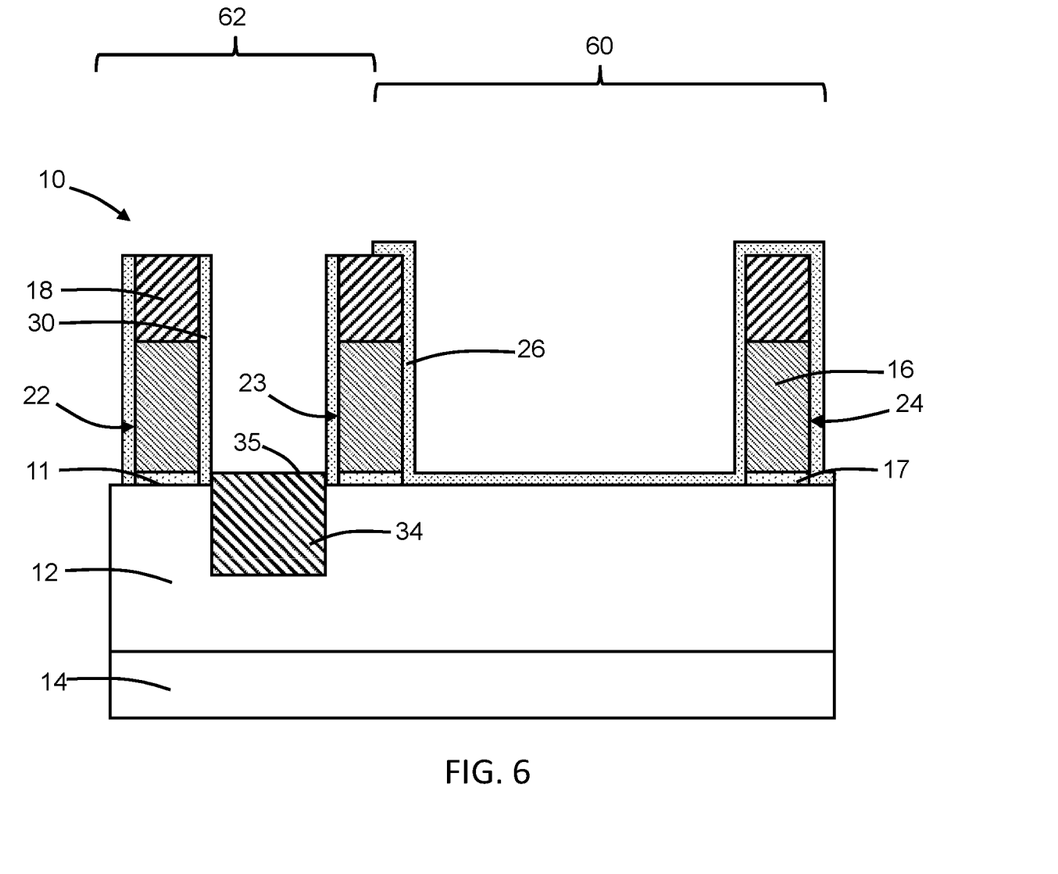

With reference to FIG. 6 in which like reference numerals refer to like features in FIG. 5 and at a subsequent fabrication stage, a layer 34 of a semiconductor material is grown by an epitaxial growth process from the surfaces of the fin 12 bordering the cavity 32. The layer 34 may extend laterally outward from the space between the gate structures 22, 23 with a faceted shape. The epitaxially-grown layer 34 has a top surface 35 that may project above the top surface 11 of the fin 12.

The epitaxial growth process may be selective in that the semiconductor material does not grow from dielectric surfaces, such as the hardmask sections 18, the conformal layer 26, or the sidewall spacers 30. The layer 34 may be in situ doped during epitaxial growth with a concentration of a dopant. In an embodiment, the layer 34 may be in situ doped during epitaxial growth with a p-type dopant (e.g., boron) that provides p-type conductivity. In an alternative embodiment, the layer 34 may be in situ doped during epitaxial growth with an n-type dopant (e.g., phosphorus and/or arsenic) that provides n-type conductivity. The layer 34 may have a composition that contains germanium and silicon and, in an embodiment, the layer 34 may be composed of silicon-germanium. In an embodiment, the layer 34 may be composed of silicon-germanium and may contain a p-type dopant. In an alternative embodiment, the layer 34 may be composed of silicon and may contain an n-type dopant.

Figure 7:
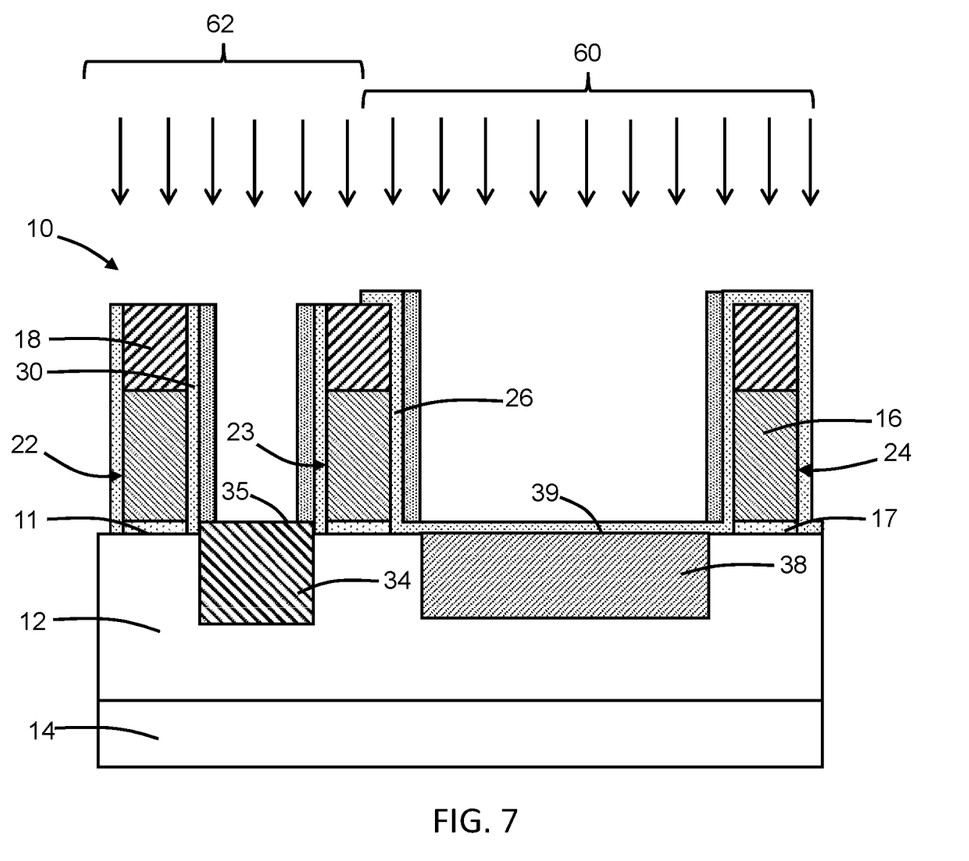

With reference to FIG. 7 in which like reference numerals refer to like features in FIG. 6 and at a subsequent fabrication stage, sidewall spacers 36 are formed adjacent to the side surfaces or sidewalls of each of the gate structures 22, 23, 24. The sidewall spacers 36 may be formed by depositing a conformal layer composed of a dielectric material, such as silicon dioxide, and etching the deposited conformal layer with an anisotropic etching process, such as reactive ion etching.

A doped region 38 may be formed in the fin 12 between the sidewall spacers 36 on the gate structures 23, 24. The doped region 38 has a top surface 39 that may be coextensive with the top surface 11 of the fin 12. The doped region 38 contains a concentration of an n-type or p-type dopant, and the doped region 38 may be doped to have the same conductivity type as the layer 34. The doped region 38 may be formed by an ion implantation process that introduces energetic ions, as indicated diagrammatically by the single-headed arrows, with ion trajectories that stop over a depth range in the fin 12. The ions may be generated from a suitable source gas and implanted into the fin 12 with given implantation conditions using an ion implantation tool. The implantation conditions (e.g., ion species, dose, kinetic energy, tilt angle) may be selected to tune the characteristics (e.g., depth profile) of the doped region 38. The layer 34 is also implanted concurrently with the doped region 38. The implantation of the layer 34 may be used, for example, to adjust the junction profile.

In an embodiment, the doped region 38 may be formed in the fin 12 by implanting ions of a p-type dopant (e.g., boron) that provides p-type electrical conductivity. In an alternative embodiment, the doped region 38 may be concurrently formed in the fin 12 by implanting ions of an n-type dopant (e.g., phosphorus and/or arsenic) that provides n-type conductivity. The gate structures 22 23, 24 and sidewall spacers 36 may function to self-align the ion-implantation process.

Figure 8:
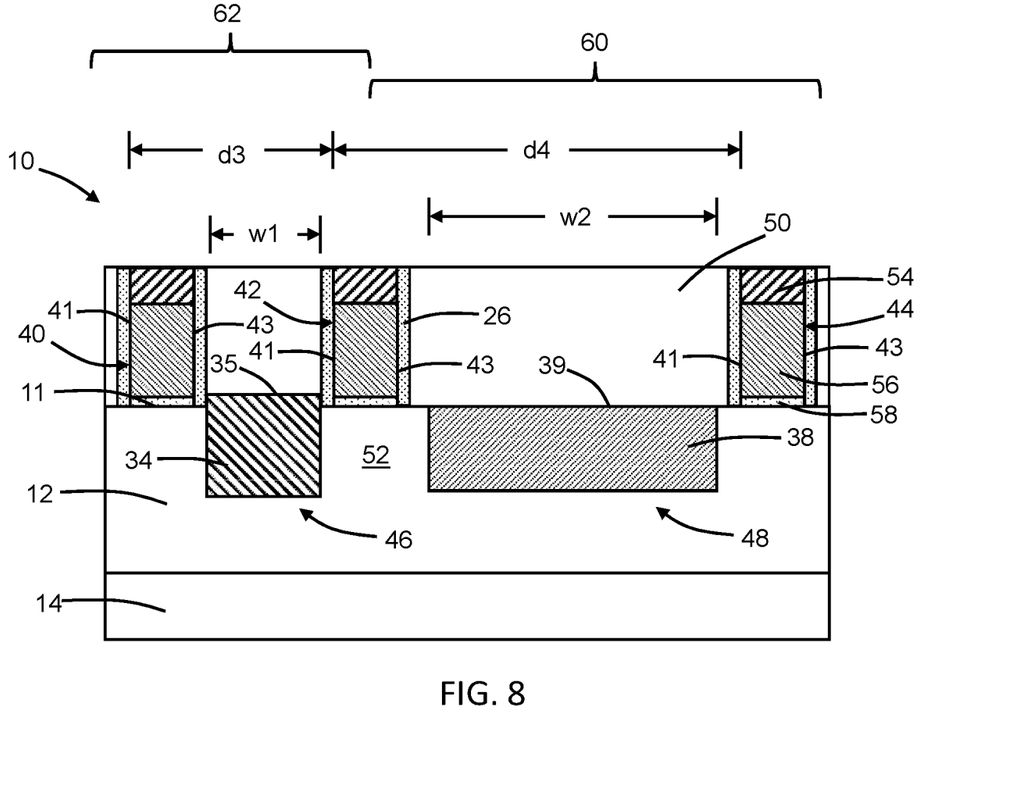

With reference to FIG. 8 in which like reference numerals refer to like features in FIG. 7 and at a subsequent fabrication stage, a replacement gate process is performed to replace the gate structures 22, 23, 24 with gate structures 40, 42, 44 and complete the structure 10 for the field-effect transistor. The gate structures 40, 42, 44 may include a layer 56 composed of one or more metal gate materials, such as work function metals, and a layer 58 composed of a dielectric material, such as a high-k dielectric material like hafnium oxide. Each of the gate structures 40, 42, 44 has opposite side surfaces or sidewalls 41, 43. A gate cap 54 may be positioned over each of the gate structures 40, 42, 44.

The gate structures 40, 42, 44 adopt the pattern, including the multiple pitches, of the gate structures 22, 23, 24 as a result of the replacement gate process. The result is that the sidewall 41 of the gate structure 40 and the sidewall 41 of the gate structure 42 are separated by a distance, d3, and the sidewall 41 of the gate structure 42 and the sidewall 41 of the gate structure 44 are separated by a distance, d4, that is greater than the distance, d3. In an embodiment, the distance, d4, may be equal or approximately equal to twice the distance, d3. In this embodiment, the gate structures 40, 42 may have a 1CPP (contacted (poly) pitch) gate pitch and the gate structures 42, 44 may have a 2CPP gate pitch. In other embodiments, the distance, d4, may be equal or approximately equal to an integer multiple of the distance, d3, contingent upon the number of adjacent hardmask sections 18 that are removed. In an embodiment in which the integer is three (3) and the gate structure 24 is removed, the gate structures 40, 42 may have a 1CPP (contacted (poly) pitch) gate pitch, and the gate structure (not shown) adjacent to gate structure 42 and the gate structure 42 may have a 3CPP gate pitch.

The structure 10 includes an embedded source/drain region 46 provided by the layer 34 and a non-embedded source/drain region 48 provided by the doped region 38. As used herein, the term "source/drain region" means a doped region of semiconductor material that can function as either a source or a drain of a field-effect transistor. The source/drain region 46 (i.e., the layer 34) is positioned laterally between the gate structure 40 and the gate structure 42, and the source/drain region 46 (i.e., the doped region 38) is positioned laterally between the gate structure 42 and the gate structure 44. The non-embedded source/drain region 48 is free of epitaxial semiconductor material and only includes the doped region 38 formed in the fin 12 by ion implantation. The fin 12 provides a semiconductor body used to form the source/drain regions 46, 48, which have an asymmetrical arrangement due to the different manner in which each is formed. A channel region 52 is disposed in the fin 12 laterally between the source/drain region 46 and the source/drain region 48 and beneath the overlying gate structure 40. Sections of an interlayer dielectric layer 50 may be located in the spaces between the gate structures 40, 42, 44 that are over the source/drain regions 46, 48.

The source/drain region 48 is positioned entirely below the top surface 11 of the fin 12. In particular, the doped region 38 providing the source/drain region 48 is positioned entirely below the top surface 11 of the fin 12 by ion implantation, and the top surface 39 of doped region 38 may be coextensive with the top surface 11. The source/drain region 46 may project above the top surface 11 of the fin 12. In particular, the epitaxially-grown layer 34 providing the source/drain region 46 may project above the top surface 11 of the fin 12 such that its top surface 35 is positioned above the top surface 11. The source/drain region 46 has a width, w1, equal to the width of the layer 34 and the source/drain region 48 has a width, w2, equal to the width of the doped region 38, and the width, w2, of the source/drain region 48 is greater than the width, w1, of the source/drain region 46. The increased width of the source/drain region 48 originates from the larger gate pitch in region 60 than in region 62.

In an embodiment, the source/drain region 46 may provide a source in the structure 10 for the field-effect transistor, and the source/drain region 48 may provide a drain in the structure 10 for the field-effect transistor. In an alternative embodiment, the source/drain region 46 may provide a drain in the structure 10 for the field-effect transistor, and the source/drain region 48 may provide a source in the structure 10 for the field-effect transistor. The source/drain regions 46, 48 are doped to have a conductivity type of the same polarity (i.e., the same conductivity type). The source/drain region 46 may have a different dopant concentration than the source/drain region 48 due to their formation at separate times and by different techniques in the process flow.

Middle-of-line processing and back-end-of-line processing follow, which includes formation of contacts, vias, and wiring for an interconnect structure that is coupled with the field-effect transistor.

In operation, a field-effect transistor with the source/drain region 46 providing the source and the source/drain region 48 providing the drain may exhibit improvements in radiofrequency performance (e.g., improvements in maximum stable gain (i.e., MSG or power gain), cut-off frequency (fT), and maximum oscillation frequency (fMax)), and an increase in breakdown voltage, in comparison with a conventional field-effect transistor having a 1CPP gate pitch for gate structures on the source side and the drain side. The wider pitch on the drain side may lower the gate-drain capacitance. The structure 10 may include additional gate structures with the varied gate pitches, and the embedded source/drain region 46 and non-embedded source/drain region 48 may be repeated for the pairs of the gate structures to form a field-effect transistor for use in a radiofrequency integrated circuit.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a semiconductor fin;
    a first gate structure that extends over the semiconductor fin, the first gate structure including a first sidewall and a second sidewall opposite the first sidewall;
    a first source/drain region including an epitaxial semiconductor layer on a first portion of the semiconductor fin and a first concentration of a dopant in the epitaxial semiconductor layer, the first source/drain region positioned adjacent to the first sidewall of the first gate structure; and
    a second source/drain region including a second concentration of the dopant in a second portion of the semiconductor fin, the second source/drain region positioned adjacent to the second sidewall of the first gate structure,
    wherein the first source/drain region and the second source/drain region have the same conductivity type, the semiconductor fin has a top surface, the second source/drain region is positioned in the second portion of the semiconductor fin entirely below the top surface of the semiconductor fin, the first source/drain region has a first width, and the second source/drain region has a second width that is greater than the first width.

2. The structure of claim 1 wherein the epitaxial semiconductor layer of the first source/drain region is formed in a cavity in the first portion of the semiconductor fin, and the epitaxial semiconductor layer of the first source/drain region has a top surface that is raised above the top surface of the semiconductor fin.

3. The structure of claim 1 further comprising:
    a second gate structure that extends over the semiconductor fin, the second gate structure positioned adjacent to the second sidewall of the first gate structure,
    wherein the second source/drain region is laterally positioned between the first gate structure and the second gate structure.

4. The structure of claim 3 further comprising:
    a third gate structure that extends over the semiconductor fin, the third gate structure positioned adjacent to the first sidewall of the first gate structure,
    wherein the first source/drain region is laterally positioned between the first gate structure and the third gate structure.

5. The structure of claim 4 wherein the second gate structure has a sidewall, the third gate structure has a sidewall, the first sidewall of the first gate structure and the sidewall of the third gate structure are separated by a first distance, and the first sidewall of the first gate structure and the sidewall of the second gate structure are separated by a second distance that is greater than the first distance.

6. The structure of claim 5 wherein the second distance is equal to an integer multiple of the first distance.

7. The structure of claim 5 wherein the second distance is equal to two times the first distance.

8. The structure of claim 1 wherein the second source/drain region is free of epitaxial semiconductor material.

9. The structure of claim 1 wherein the second concentration of the dopant is different from the first concentration.

10. The structure of claim 1 wherein the first source/drain region is a source of the field-effect transistor, and the second source/drain region is a drain of the field-effect transistor.

11. A method of forming a structure for a field-effect transistor, the method comprising:
    forming a first gate structure that extends over a semiconductor fin;
    forming an epitaxial semiconductor layer of a first source/drain region on a first portion of the semiconductor fin, the epitaxial semiconductor layer include a first concentration of a dopant; and
    forming a second source/drain region including a second concentration of the dopant in a second portion of the semiconductor fin,
    wherein the first source/drain region and the second source/drain region have the same conductivity type, the semiconductor fin has a top surface, the second source/drain region is positioned in the second portion of the semiconductor fin entirely below the top surface of the semiconductor fin, the first gate structure includes a first sidewall and a second sidewall opposite the first sidewall, the first source/drain region is positioned adjacent to the first sidewall of the first gate structure, the second source/drain region positioned adjacent to the second sidewall of the first gate structure, the first source/drain region has a first width, and the second source/drain region has a second width that is greater than the first width.

12. The method of claim 11 wherein the epitaxial semiconductor layer of the first source/drain region is formed in a cavity in the first portion of the semiconductor fin, and the epitaxial semiconductor layer of the first source/drain region has a top surface that is raised above the top surface of the semiconductor fin.

13. The method of claim 11 further comprising:
    forming a second gate structure that extends over the semiconductor fin,
    wherein the second source/drain region is laterally positioned between the first gate structure and the second gate structure.

14. The method of claim 13 further comprising:
forming a third gate structure that extends over the semiconductor fin,
wherein the epitaxial semiconductor layer of the first source/drain region is laterally positioned between the first gate structure and the third gate structure.

15. The method of claim 14 wherein the second gate structure has a sidewall, the third gate structure has a sidewall, the first sidewall of the first gate structure and the sidewall of the third gate structure are separated by a first distance, and the first sidewall of the first gate structure and the sidewall of the second gate structure are separated by a second distance that is greater than the first distance.

16. The method of claim 15 wherein the second distance is equal to an integer multiple of the first distance.

17. The method of claim 11 wherein the second source/drain region is free of epitaxial semiconductor material.

* * * * *